(12) United States Patent
Ichikawa (10) Patent No.: US 9,126,491 B2
(45) Date of Patent: Sep. 8, 2015

(54) SHIELD AND VEHICLE INCORPORATING THE SHIELD

(75) Inventor: Shinji Ichikawa, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 34 days.

(21) Appl. No.: 13/510,508

(22) PCT Filed: Dec. 17, 2009

(86) PCT No.: PCT/JP2009/071015
§ 371 (c)(1),
(2), (4) Date: May 17, 2012

(87) PCT Pub. No.: WO2011/074091
PCT Pub. Date: Jun. 23, 2011

(65) Prior Publication Data
US 2012/0242447 A1     Sep. 27, 2012

(51) Int. Cl.
| | |
|---|---|
| *G01V 3/10* | (2006.01) |
| *H01F 27/36* | (2006.01) |
| *H01F 38/30* | (2006.01) |
| *H01F 27/02* | (2006.01) |
| *H01F 27/28* | (2006.01) |

(Continued)

(52) U.S. Cl.
CPC ........... *B60L 11/182* (2013.01); *B60L 11/1829* (2013.01); *B60L 11/1833* (2013.01); *H01F 27/36* (2013.01); *H01F 38/14* (2013.01); *H05K 9/0075* (2013.01); *B60L 2210/40* (2013.01); *B60L 2270/147* (2013.01); *Y02T 10/7005* (2013.01); *Y02T 10/7241* (2013.01); *Y02T 90/12* (2013.01); *Y02T 90/121* (2013.01); *Y02T 90/122* (2013.01); *Y02T 90/125* (2013.01); *Y02T 90/127* (2013.01); *Y02T 90/14* (2013.01)

(58) Field of Classification Search
CPC ..... H01F 27/362; H01F 27/365; H01F 27/36; H01F 27/367; H01F 37/00; H01F 2038/026; H01F 27/38; H01F 27/289
USPC .................................... 336/84 R, 84 C, 84 M
See application file for complete search history.

(56) References Cited

U.S. PATENT DOCUMENTS

| | | | | |
|---|---|---|---|---|
| 3,175,173 | A | * | 3/1965 | Welch .......................... 336/84 R |
| 3,996,510 | A | * | 12/1976 | Guichard ....................... 327/510 |

(Continued)

FOREIGN PATENT DOCUMENTS

| | | |
|---|---|---|
| AU | 2006269374 B2 | 1/2007 |
| AU | 2006269374 C1 | 1/2007 |

(Continued)

OTHER PUBLICATIONS

International Search Report mailed Mar. 16, 2010 issued in International Patent Application No. PCT/JP2009/071015 (with translation).

(Continued)

*Primary Examiner* — Elvin G Enad
*Assistant Examiner* — Kazi Hossain
(74) *Attorney, Agent, or Firm* — Oliff PLC (57) ABSTRACT

A shield for a coil unit to carry out non-contact power feeding by a resonance method includes a magnetic sheet capable of reducing a magnetic field, and a copper shield capable of reducing both an electric field and magnetic field. The magnetic sheet is arranged to take a layered configuration at a side closer to the coil unit than the copper shield.

8 Claims, 5 Drawing Sheets

(51) Int. Cl.
*B60L 11/18* (2006.01)
*H01F 38/14* (2006.01)
*H05K 9/00* (2006.01)

(56) References Cited

U.S. PATENT DOCUMENTS

| | | | |
|---|---|---|---|
| 4,220,920 A * | 9/1980 | Gross | 324/442 |
| 4,651,565 A * | 3/1987 | Keene | 73/514.39 |
| 4,725,804 A * | 2/1988 | Yarpezeshkan | 336/5 |
| 4,794,318 A * | 12/1988 | Maschek et al. | 323/358 |
| 5,287,074 A * | 2/1994 | Meguro et al. | 333/12 |
| 5,949,155 A * | 9/1999 | Tamura et al. | 307/107 |
| 6,154,005 A | 11/2000 | Hyogo et al. | |
| 7,741,734 B2 | 6/2010 | Joannopoulos et al. | |
| 2001/0003416 A1 | 6/2001 | Kajiura | |
| 2001/0004201 A1 | 6/2001 | Kajiura | |
| 2005/0116802 A1* | 6/2005 | Gomez et al. | 336/200 |
| 2007/0222542 A1 | 9/2007 | Joannopoulos et al. | |
| 2007/0254726 A1* | 11/2007 | Iida | 455/572 |
| 2008/0252409 A1* | 10/2008 | Kojima | 336/185 |
| 2008/0278264 A1 | 11/2008 | Karalis et al. | |
| 2009/0015362 A1 | 1/2009 | Okada et al. | |
| 2009/0195332 A1 | 8/2009 | Joannopoulos et al. | |
| 2009/0195333 A1 | 8/2009 | Joannopoulos et al. | |
| 2009/0224856 A1 | 9/2009 | Karalis et al. | |
| 2009/0267709 A1 | 10/2009 | Joannopoulos et al. | |
| 2009/0267710 A1 | 10/2009 | Joannopoulos et al. | |
| 2010/0096934 A1 | 4/2010 | Joannopoulos et al. | |
| 2010/0102639 A1 | 4/2010 | Joannopoulos et al. | |
| 2010/0102640 A1 | 4/2010 | Joannopoulos et al. | |
| 2010/0102641 A1 | 4/2010 | Joannopoulos et al. | |
| 2010/0117455 A1 | 5/2010 | Joannopoulos et al. | |
| 2010/0117456 A1 | 5/2010 | Karalis et al. | |
| 2010/0123353 A1 | 5/2010 | Joannopoulos et al. | |
| 2010/0123354 A1 | 5/2010 | Joannopoulos et al. | |
| 2010/0123355 A1 | 5/2010 | Joannopoulos et al. | |
| 2010/0127573 A1 | 5/2010 | Joannopoulos et al. | |
| 2010/0127574 A1 | 5/2010 | Joannopoulos et al. | |
| 2010/0127575 A1 | 5/2010 | Joannopoulos et al. | |
| 2010/0133918 A1 | 6/2010 | Joannopoulos et al. | |
| 2010/0133919 A1 | 6/2010 | Joannopoulos et al. | |
| 2010/0133920 A1 | 6/2010 | Joannopoulos et al. | |
| 2010/0171370 A1 | 7/2010 | Karalis et al. | |
| 2010/0181844 A1 | 7/2010 | Karalis et al. | |
| 2010/0187911 A1 | 7/2010 | Joannopoulos et al. | |
| 2010/0201205 A1 | 8/2010 | Karalis et al. | |
| 2010/0207458 A1 | 8/2010 | Joannopoulos et al. | |
| 2010/0225175 A1 | 9/2010 | Karalis et al. | |
| 2010/0231053 A1 | 9/2010 | Karalis et al. | |
| 2010/0237706 A1 | 9/2010 | Karalis et al. | |
| 2010/0237707 A1 | 9/2010 | Karalis et al. | |
| 2010/0237708 A1 | 9/2010 | Karalis et al. | |
| 2010/0253152 A1 | 10/2010 | Karalis et al. | |
| 2010/0264745 A1 | 10/2010 | Karalis et al. | |
| 2010/0289610 A1* | 11/2010 | Jacobson et al. | 336/84 C |

FOREIGN PATENT DOCUMENTS

| | | |
|---|---|---|
| AU | 2007349874 A2 | 10/2008 |
| AU | 2010200044 A1 | 1/2010 |
| CA | 2 615 123 A1 | 1/2007 |
| CA | 2 682 284 A1 | 10/2008 |
| CN | 2102592 U | 4/1992 |
| CN | 101258658 A | 9/2008 |
| CN | 101345327 A | 1/2009 |
| CN | 101682216 A | 3/2010 |
| CN | 101860089 A | 10/2010 |
| EP | 1 902 505 A2 | 3/2008 |
| EP | 2 130 287 A1 | 12/2009 |
| IN | 735/DELNP/2008 | 5/2008 |
| IN | 6195/DELNP/2009 | 7/2010 |
| JP | B1-48-11658 | 4/1973 |
| JP | U-61-18607 | 2/1986 |
| JP | U-1-159404 | 11/1989 |
| JP | Y2-2-8419 | 2/1990 |
| JP | A-8-163792 | 6/1996 |
| JP | A-11-273977 | 10/1999 |
| JP | A-2001-176739 | 6/2001 |
| JP | A-2001-178001 | 6/2001 |
| JP | A-2008-021991 | 1/2008 |
| JP | A-2009-21357 | 1/2009 |
| JP | A-2009-501510 | 1/2009 |
| JP | A-2009-106136 | 5/2009 |
| KR | 2008-0031398 A | 4/2008 |
| KR | 2010-0015954 A | 2/2010 |
| WO | WO 2007/008646 A2 | 1/2007 |
| WO | WO 2008/118178 A1 | 10/2008 |

OTHER PUBLICATIONS

Partial English translation of Aug. 27, 2013 Office Action issued in Chinese Patent Application No. 200980162903.7.
Partial English translation of Oct. 1, 2013 Office Action issued in Japanese Patent Application No. 2011-545893.
Apr. 14, 1973 Patent Publication Gazette for Patent Publication No. JP-B1-48-11658.
Translation of Jul. 16, 2013 Office Action issued in Japanese Patent Application No. 2011-545893.

* cited by examiner

SHIELD AND VEHICLE INCORPORATING THE SHIELD

TECHNICAL FIELD

The present invention relates to a shield and a vehicle incorporating the shield. More particularly, the present invention relates to a configuration of an electromagnetic shield of a coil unit for non-contact power supply through a resonance method.

BACKGROUND ART

As environment-friendly vehicles, attention is now focused on vehicles incorporating a power storage device (for example, secondary cell or capacitor) and running by means of a driving force generated from the electric power stored in the power storage device. Such vehicles include, for example, electric vehicles, hybrid vehicles, fuel cell vehicles and the like.

Hybrid vehicles of the type capable of charging a vehicle-mounted power storage device from a power supply external to the vehicle is known, likewise with an electric vehicle. For example, there is known the so-called "plug-in hybrid vehicle" that allows the power storage device to be charged from a general household power supply by connecting the plug socket located at an establishment with the charging inlet provided at the vehicle.

As a method for power transfer, attention is recently focused on wireless electrical power transmission not using power supply cords and/or cables. Three promising approaches of this wireless power transfer technique are known, i.e. power transfer using electromagnetic induction, power transfer using electromagnetic waves, and power transfer through the resonance method.

The resonance method thereof directed to noncontact power transfer causes a pair of resonators (for example, a pair of self-resonant coils) to resonate at an electromagnetic field (near field) for electrical transmission by the electromagnetic field, allowing electric power as high as several kW to be transferred over a relatively long distance (for example, several meters).

Japanese Patent Laying-Open No. 2009-106136 (PTL 1) discloses the technique of charging a power storage device mounted on a vehicle by receiving charging power in a wireless manner from a power supply external to the vehicle by a resonance method.

CITATION LIST

Patent Literature

PTL 1: Japanese Patent Laying-Open No. 2009-106136

SUMMARY OF INVENTION

Technical Problem

In non-contact power transmission by means of the resonance method, electric power is transferred through the electromagnetic field, as mentioned above. Since the distance over which power is transferred is relatively long in the resonance method, the range of the electromagnetic field generated may be large as compared to the case where electromagnetic induction is employed.

The electromagnetic field generated around the coil units including the self-resonant coils may become electromagnetic noise towards other electric equipment. For example, the electromagnetic field may become the cause of noise to the radio and the like. Further, in the case where there is a conductor within the electromagnetic field, the conductor may be heated by electromagnetic induction through the electromagnetic field to become the cause of failure in the device due to increase in temperature.

During power transfer using a resonance method, it is desirable to block the generated electromagnetic field in all directions other than the direction of the opposite coil units. To this end, there is a case where an electromagnetic blocking member (shield) is arranged around the coil units.

Although the electric field and magnetic field must be blocked by the shield, there is a case where the shield may affect the power transmission efficiency depending upon the type of shield selected.

In view of the foregoing, an object of the present invention is to provide a configuration for a shield employed in a non-contact power supply system by a resonance method, capable of preventing leakage of the electromagnetic field while suppressing reduction in the power transmission efficiency.

Solution to Problem

The shield according to the present invention is for a coil employed in non-contact power transmission to carry out at least one of transmission and reception of electric power by an electromagnetic field through electromagnetic resonance. The shield includes a first shield member capable of reducing a magnetic field, and a second shield member. The second shield member is capable of reducing both an electric field and magnetic field more, but with greater loss, than the first shield member. The first shield member is arranged closer to the coil than the second shield member.

Preferably, the first shield member is configured including a magnetic material.

Preferably, the second shield member is a conductor containing copper.

Preferably, the shield is formed to take a vessel shape, allowing a coil to be stored inside, and having one direction not blocked.

Preferably, the first and second shield members are arranged to form contact with each other.

A vehicle according to the present invention is capable of receiving electric power in a non-contact manner by an electromagnetic field through electromagnetic resonance with a power transmission device. The vehicle includes a coil for receiving electric power from the power transmission device, and a shield provided around the coil, and capable of blocking the electromagnetic field. The shield includes a first shield member capable of reducing a magnetic field, and a second shield member capable of reducing both an electric field and magnetic field more, but with greater loss, than the first shield member. The first shield member is arranged closer to the coil than the second shield member.

Advantageous Effects of Invention

By applying the shield configuration of the present invention to a non-contact power feeding system through a resonance method, leakage of the electromagnetic field can be prevented while suppressing reduction in the power transmission efficiency during power feeding.

DESCRIPTION OF EMBODIMENT

Embodiments of the present invention will be described in detail hereinafter with reference to the drawings. In the drawings, the same or corresponding elements have the same reference characters allotted, and description thereof will not be repeated.

Figure 1:
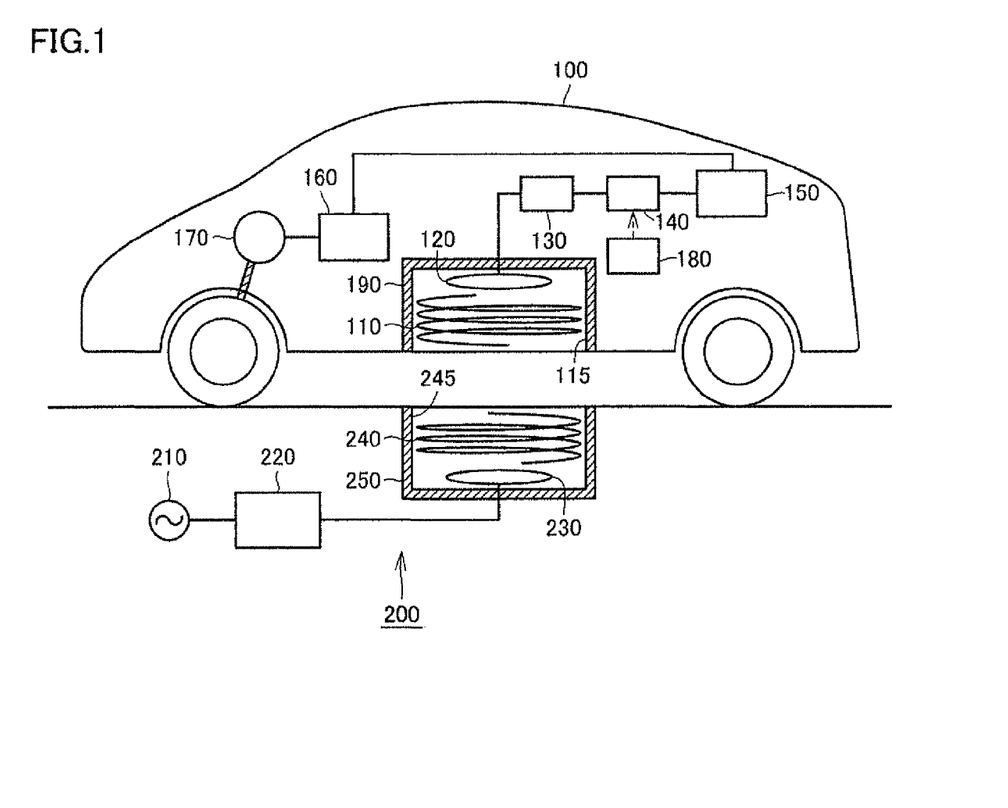
FIG. 1 represents an entire configuration of a non-contact power feeding system including a shield according to an embodiment of the present invention.

FIG. 1 represents an entire configuration of a non-contact power feeding system including a shield according to an embodiment of the present invention. Referring to FIG. 1, the non-contact power feeding system includes a vehicle 100, and a power feed device 200. Vehicle 100 includes a secondary self-resonant coil 110, a secondary coil 120, a rectifier 130, a DC/DC converter 140, a power storage device 150, and a coil case 190. Vehicle 100 further includes a power control unit (hereinafter, also referred to as PCU) 160, a motor 170, and a vehicle ECU (Electronic Control Unit) 180.

The configuration of vehicle 100 is not limited to that shown in FIG. 1 as long as the vehicle incorporates a power storage device and is driven by a motor. For example, vehicle 100 includes a hybrid vehicle with a motor and an internal combustion engine, a fuel cell vehicle including a fuel cell, or the like.

Secondary self-resonant coil 110 is installed, for example, at a lower section of the vehicle. Secondary self-resonant coil 110 is an LC resonant coil having both ends open (non-connected), receiving electric power from a power feed device 200 by resonance through an electromagnetic field with a primary self-resonant coil 240 (described afterwards) of power feed device 200. The capacitance component of secondary self-resonant coil 110 may be the parasitic capacitance of the coil, or an additional capacitor (not shown) may be connected across the coil to obtain a predetermined capacitance.

Secondary self-resonant coil 110 has its number of windings set appropriately such that the Q value representing the intensity of resonance between primary self-resonant coil 240 and secondary self-resonant coil 110 (for example, Q>100), the κ value representing the degree of coupling thereof, and the like become higher based on the distance from primary self-resonant coil 240 of power feed device 200, the resonant frequency of primary self-resonant coil 240 and secondary self-resonant coil 110, and the like.

Secondary coil 120 is coaxially arranged with secondary self-resonant coil 110, and can be coupled magnetically with secondary self-resonant coil 110 by electromagnetic induction. This secondary coil 120 extracts the electric power received by secondary self-resonant coil 110 through electromagnetic induction for output to rectifier 130.

Coil case 190 houses secondary coil 120 and secondary self-resonant coil 110 inside. The inner face of coil case 190 is attached with an electromagnetic shield member (hereinafter, also referred to as "shield") 115 to prevent the electromagnetic field generated around secondary self-resonant coil 110 from leaking out around coil case 190. It is to be noted that coil case 190 may be formed by shield 115. Moreover, the vehicle body itself may have a recess formed to allow storage of secondary coil 120 and secondary self-resonant coil 110, functioning equivalent of coil case 190.

Rectifier 130 rectifies AC power output by secondary coil 120. Based on a control signal from vehicle ECU 180, DC/DC converter 140 converts the electric power rectified by rectifier 130 to a voltage level of power storage device 150 for output thereto. In the case where electric power is to be received from power feed device 200 during a vehicle running operation, DC/DC converter 140 may convert the electric power rectified by rectifier 130 into system voltage for direct supply to PCU 160. DC/DC converter 140 is dispensable. The AC power output from secondary coil 120 may be directly applied to power storage device 150 after being rectified by rectifier 130.

Power storage device 150 is a rechargeable DC power source, and is formed of a secondary battery such as lithium ion battery or nickel-metal hydride battery. Power storage device 150 stores the electric power supplied from DC/DC converter 140. Power storage device 150 also stores regenerative power generated by motor 170. Power storage device 150 supplies the stored electric power to PCU 160. A capacitor of large capacitance may be employed as power storage device 150. Any power buffer is applicable as long as it can temporarily store the electric power supplied from power feed device 200 or the regenerative power from motor 170 and supply the stored electric power to PCU 160.

PCU 160 is configured including a boost converter, an inverter, and the like not shown. PCU 160 uses the electric power output from power storage device 150 or the electric power directly supplied from DC/DC converter 140 to drive motor 170. PCU 160 causes the regenerative power generated from motor 170 to be rectified and output to power storage device 150 to charge power storage device 150. Motor 170 is driven by PCU 160 to generate and provide the vehicle driving force to the driving wheel. Motor 170 generates power by the rotary force of the driving wheel or from an engine not shown in the case of a hybrid vehicle to provide the generated regenerative power to PCU 160.

Vehicle ECU 180 controls DC/DC converter 140 in a power feeding operation from power feed device 200 to vehicle 100. Vehicle ECU 180 regulates the voltage between rectifier 130 and DC/DC converter 140 at a predetermined target voltage by controlling DC/DC converter 140, for example. In a vehicle running operation, vehicle ECU 180 controls PCU 160 based on the vehicle running status and/or state of charge (also referred to as SOC) of power storage device 150.

Power feed device 200 includes an AC power source 210, a high frequency power driver 220, a primary coil 230, a primary self-resonant coil 240, and a coil case 250.

AC power source 210 is a power supply external to the vehicle, for example a commercial utility power supply. High-frequency power driver 220 converts the electric power received from AC power source 210 into electric power of high frequency, and supplies the converted high-frequency power to primary coil 230. The frequency of the high-frequency power generated by high-frequency power driver 220 is, for example, 1 MHz to ten and several MHz.

Primary coil 230 is coaxially arranged with primary self-resonant coil 240, and can be coupled magnetically with primary self-resonant coil 240 by electromagnetic induction. Primary coil 230 feeds the high-frequency electric power supplied from high-frequency power driver 220 to primary self-resonant coil 240 by electromagnetic induction.

Primary self-resonant coil 240 is arranged in the proximity of the ground, for example. Primary self-resonant coil 240 is an LC resonant coil having both ends open (non-contact), and transfers electric power to vehicle 100 by resonating with secondary self-resonant coil 110 of vehicle 100 by the electromagnetic field. The capacitance component of primary self-resonant coil 240 may be the parasitic capacitance of the coil, or an additional capacitor (not shown) may be connected across the coil to obtain a predetermined capacitance, likewise with secondary self-resonant coil 110.

Primary self-resonant coil 240 similarly has its number of windings set appropriately such that the Q value (for example, Q>100), the κ value representing the degree of coupling thereof, and the like become higher based on the distance from secondary self-resonant coil 110 of vehicle 100, the resonant frequency of primary self-resonant coil 240 and secondary self-resonant coil 110, and the like.

Coil case 250 houses primary coil 230 and primary self-resonant coil 240 inside. The inner face of coil case 250 has a shield 245 attached to prevent the electromagnetic field generated around primary self-resonant coil 240 from leaking out around coil case 250. It is to be noted that coil case 250 may be formed by shield 245.

Figure 2:
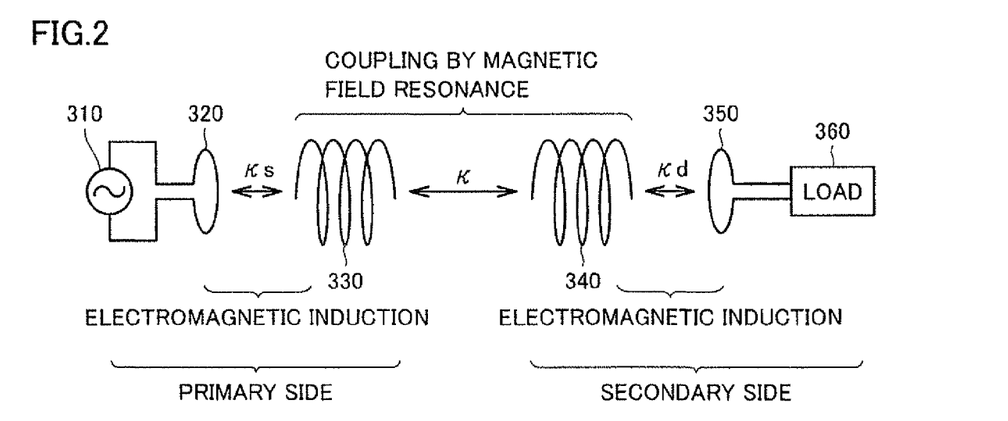
FIG. 2 is a diagram to describe the mechanism of power transmission by a resonance method.

FIG. 2 is a diagram to describe the mechanism of power transfer by the resonance method. Referring to FIG. 2, the resonance method is similar to the resonance of two tuning forks. By the resonance of two LC resonant coils having the same natural frequency at the electromagnetic field (near field), electric power is transferred from one coil to the other coil via the electromagnetic field.

Specifically, primary coil 320 is connected to high-frequency power source 310, and high-frequency electric power of 1 MHz to ten and several MHz is supplied towards primary self-resonant coil 330 magnetically coupled with primary coil 320 by electromagnetic induction. Primary self-resonant coil 330 is an LC resonator based on the inductance of its own coil and the parasitic capacitance (when a capacitor is connected to the coil, including the capacitance of the capacitor), and resonates via an electromagnetic field (near field) with secondary self-resonant coil 340 that has a resonant frequency similar to that of primary self-resonant coil 330. Accordingly, energy (electric power) is transferred from primary self-resonant coil 330 to secondary self-resonant coil 340 by the electromagnetic field. The energy (electric power) transferred to secondary self-resonant coil 340 is extracted by secondary coil 350 magnetically coupled with secondary self-resonant coil 340 by electric magnetic induction to be supplied to a load 360. The power transfer by the resonance method is realized when the Q value indicating the intensity of resonance between primary self-resonant coil 330 and secondary self-resonant coil 340 is greater than 100, for example.

In view of the corresponding relationship with respect to FIG. 1, AC power source 210 and high-frequency power driver 220 of FIG. 1 correspond to high-frequency power source 310 of FIG. 2. Primary coil 230 and primary self-resonant coil 240 of FIG. 1 correspond to primary coil 320 and primary self-resonant coil 330, respectively, of FIG. 2. Secondary self-resonant coil 110 and secondary coil 120 of FIG. 1 correspond to secondary self-resonant coil 340 and secondary coil 350, respectively, of FIG. 2. Elements of rectifier 130 and et seq. in FIG. 1 are generically represented as load 360.

Figure 3:
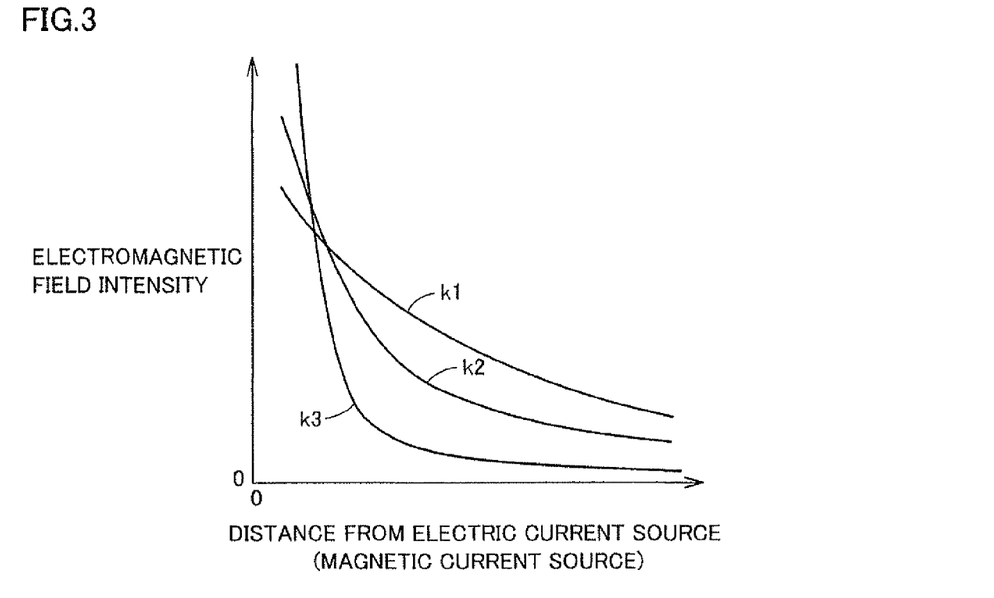
FIG. 3 represents the relationship between the distance from an electric current source (magnetic current source) and electromagnetic field intensity.

FIG. 3 represents the relationship between the distance from the electrical current source (magnetic current source) and the electromagnetic field intensity. Referring to FIG. 3, the electromagnetic field is formed of three components. Line k1 represents a component inversely proportional to the distance from the wave source, and is referred to as "radiation electromagnetic field". Line k2 represents a component inversely proportional to the square of the distance from the wave source, and is referred to as "induction electromagnetic field". Line k3 represents a component inversely proportional to the cube of the distance from the wave source, and is referred to as "static electromagnetic field".

"Static electromagnetic field" is the region where the intensity of the electromagnetic wave decreases drastically according to the distance from the wave source. In the resonance method, energy (electric power) is transmitted taking advantage of the near field (evanescent field) where the "static electromagnetic field" is dominant. Specifically, by causing a pair of resonators (for example, a pair of LC resonant coils) having the same natural frequency to resonate in the near field where "static electromagnetic field" is dominant, energy (electric power) is transmitted from one resonator (primary self-resonant coil) to the other resonator (secondary self-resonant coil). Since the "static electromagnetic field" does not pass on energy (electric power) far away, the resonance method allows power to be transmitted with lower energy loss as compared to an electromagnetic wave that transmits energy (electric power) by the "radiation electromagnetic field" that passes on energy over a great distance.

Figure 4:
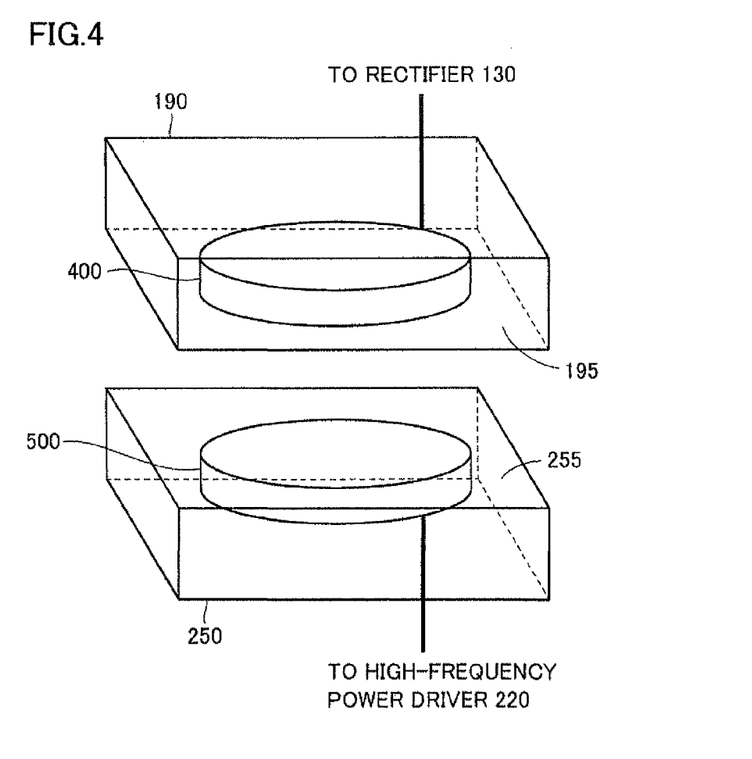
FIG. 4 is a diagram to describe a configuration of a coil case shown in FIG. 1.

FIG. 4 is a diagram to describe in detail the configuration of coil cases 190, 250 shown in FIG. 1. In FIG. 4, a power-reception side coil unit formed including secondary self-resonant coil 110 and secondary coil 120 (hereinafter, also referred to as "power reception unit") 400 is simply depicted taking a cylindrical shape. Furthermore, a power-transmission side coil unit formed including primary self-resonant coil 240 and primary coil 230 (hereinafter, also referred to as "power transmission unit") 500 is simply depicted taking a cylindrical shape.

Referring to FIG. 4, coil case 190 is arranged such that a plane 195 of the largest area faces the power transmission unit. Coil case 190 is formed in a box shape having an open plane 195. The five faces of coil case 190 other than plane 195 has a shield (not shown) attached to cover the inner surface of coil case 190 to prevent the resonating electric magnetic field (near field) generated around power reception unit 400 in a power receiving mode from transmission unit 500 from leaking towards the surrounding.

Then, power reception unit 400 configured including secondary self-resonant coil 110 and secondary coil 120 is arranged in coil case 190. Power reception unit 400 receives power from power transmission unit 500 via the opening region (plane 195) of coil case 190. The reason why plane 195 having the largest area is arranged to face power transmission unit 500 is to maximize the power transmission efficiency from power transmission unit 500 to power reception unit 400.

Coil case 250 similarly has a plane 255 of the largest area arranged to face power reception unit 400. Coil case 250 is formed taking a box shape having an opening corresponding to plane 255, for example. The five faces of coil case 250 other than plane 255 has a shield attached to cover the inner surface of coil case 250 to prevent the resonant electromagnetic field generated around power transmission unit 500 in a power transmission mode from leaking towards the surrounding.

Power transmission unit 500 configured including primary self-resonant coil 240 and primary coil 230 is arranged in coil case 250. Power transmission unit 500 transmits power to power reception unit 400 via the opening region (plane 255) of coil case 250. The reason why plane 255 having the largest area is arranged to face the power reception unit is to maximize the power transmission efficiency from power transmission unit 500 to power reception unit 400.

Thus, the coil case in which a coil unit is housed has a shield attached to the inner surface to prevent leakage of the electromagnetic field. Various materials are known for the shield. the power transmission efficiency in a power feeding mode is greatly affected depending upon what material and configuration for the shield are employed.

In general, an electromagnetic wave constituting an electromagnetic field is propagated with mutual influence between the electric field and magnetic field. Therefore, the electric field and magnetic field must be blocked as the function of the shield.

For a magnetic field shield that blocks a magnetic field, a ferromagnetic material of high magnetic permeability such as ferrite and/or permalloy is generally employed. For an electric field shield that blocks an electric field, a conductor of low electrical resistance such as of copper and/or aluminum is generally employed.

Figure 5:
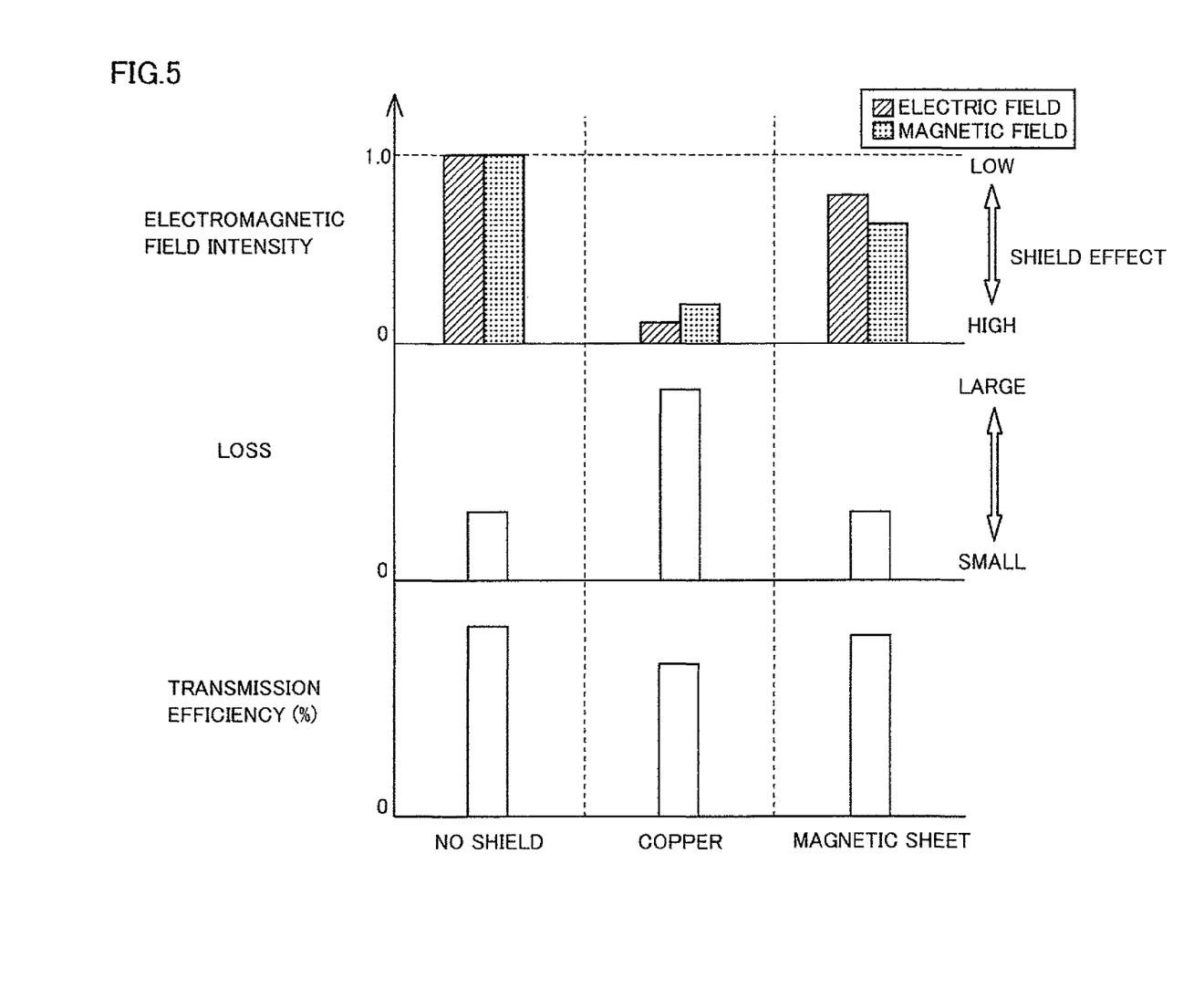
FIG. 5 is a diagram to describe an example of shield characteristics.

FIG. 5 is a diagram to describe an example of shield characteristics depending upon whether a shield is provided or not, and the type of shield. FIG. 5 represents the electromagnetic field intensity, the loss by the shield, and the transmission efficiency when non-contact power feeding is performed by a resonance method, corresponding to the case where a shield is not employed, and corresponding to the case where a shield made of copper, and a magnetic sheet are employed. The electric magnetic field intensity is represented by the ratio with 1.0 corresponding to the case where a shield is not employed. A smaller electromagnetic field intensity implies a higher shield effect. the loss includes electric power not received and reflected back due to deviation in impedance to be returned, among the power transmitted from the power transmission unit, and/or power consumption due to electric resistance and the like.

When there is no shield, the loss is relatively low since any effect caused by a shield is absent. Therefore, the transmission efficiency in a power feeding mode is relatively high.

When copper is employed for the shield, the electromagnetic field intensity indicates that the electric field and also the magnetic field intensity are reduced, as compared to the case where there is no shield, exhibiting a high shield effect. Since copper is a conductive metal having a low electric resistance, the effect as an electric field shield is high, as mentioned above. However, since copper is a nonmagnetic material, the magnetic field cannot be readily absorbed at low loss such as by a magnetic material. However, when variation in the magnetic field that acts on copper occurs, eddy current will be generated in the proximity of the copper surface by electromagnetic induction. The magnetic field generated by this eddy current acts in a direction impeding the magnetic field that acts on copper. Since the intensity of the magnetic field is reduced thereby, copper will function as a magnetic field shield despite being a nonmagnetic material. At this stage, energy loss increases due to the generation of Joule heat by the eddy current. Therefore, a shield employing copper may eventually reduce the transmission efficiency due to the loss by the eddy current (eddy current loss) although the shield effect is high.

In the case where a magnetic sheet is employed for a shield, a shield effect of a level equal to that of copper cannot be achieved, although the shield effect of magnetic field is higher as compared to an electric field. However, since the reflected electric power can be reduced when a magnetic sheet is employed, the loss caused by the shield can be made substantially equal to that absent of a shield. Therefore, reduction in the transmission efficiency when a magnetic sheet is employed is smaller as compared to a copper shield.

Thus, the shield for a coil unit according to the present embodiment has a layered configuration in which a metal shield of a conductor such as copper is arranged at the outermost layer, and a magnetic body of low loss is arranged at the inner side (that is, the side closer to the coil unit). Since the magnetic field component can be reduced at low loss by the magnetic material according to the configuration set forth above, the magnetic field acting on the outermost metal shield is reduced to allow reduction in the eddy current loss. As a result, preventing the leakage of the electromagnetic field while suppressing reduction in the transmission efficiency in a power feeding mode can be expected.

Figure 6:
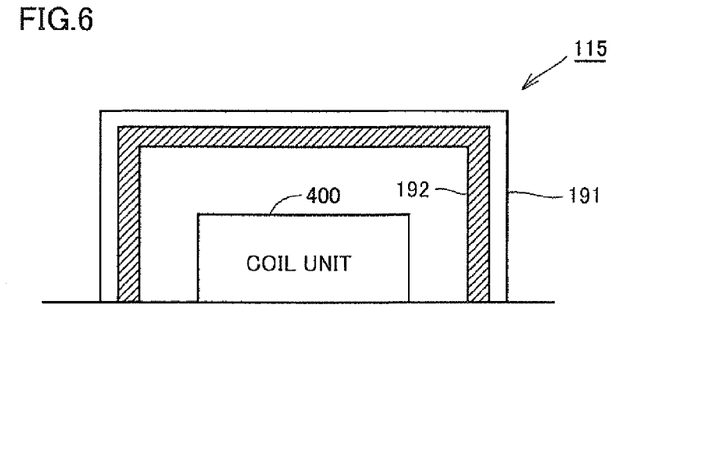
FIG. 6 is a diagram to describe a specific configuration of a shield according to an embodiment.

FIG. 6 is a diagram to describe a specific configuration of a shield according to the present embodiment. Although an example of a shield 115 for a power reception unit 400 on part of vehicle 100 will be described with reference to FIG. 6 and FIGS. 7 and 8 that will be described afterwards, the same applies to a shield 245 for power transmission unit 500. For the sake of simplification, description directed to coil case 190 is omitted in FIGS. 6-8.

Referring to FIG. 6, shield 115 includes a copper shield 191 and a magnetic sheet 192. Copper shield 191 is arranged at the inner side of the coil case not shown. magnetic sheet 192 is arranged at the inner side of copper shield 191 to form contact therewith.

Figure 7:
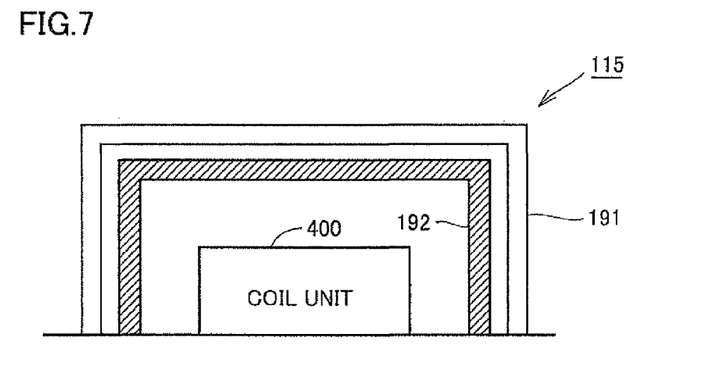
FIG. 7 is a diagram to describe a configuration of another example of a shield according to an embodiment.
Figure 8:
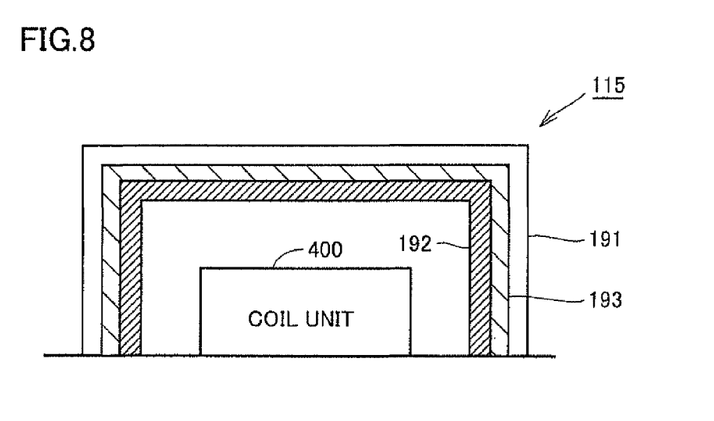
FIG. 8 is a diagram to describe a configuration of still another example of a shield according to an embodiment.

Alternatively, magnetic sheet 192 may be arranged with a space from copper shield 191, as shown in FIG. 7. Further alternatively, another material such as resin 193 may be arranged between magnetic sheet 192 and copper shield 191, as shown in FIG. 8.

Although the example above has been described based on the usage of a copper shield and a magnetic sheet, a shield of a layered structure as set forth above may be employed using electric field shields and magnetic field shields of other types. Furthermore, a multilayer structure employing three or more types of shields may be used.

Figure 9:
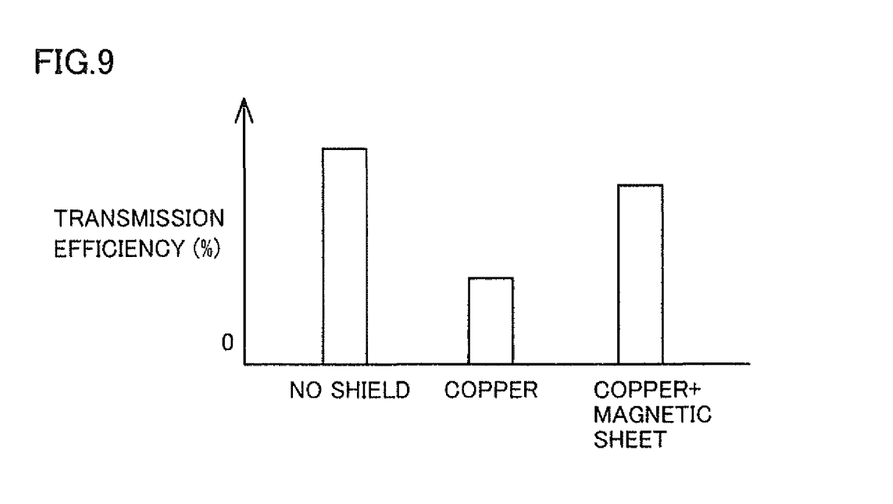
FIG. 9 represents an example of power transmission efficiency when electric power is fed by a resonance method according to the case where there is a shield or not, as well as different types of the shield.

FIG. 9 represents an example of power transmission efficiency when electric power is fed by the resonance method corresponding to the case where a shield is not employed, a copper shield alone is employed, and a layered shield described in the present embodiment is employed.

It is appreciated from FIG. 9 that the transmission efficiency during power feeding is improved by a configuration in which a magnetic sheet and a copper shield are arranged in a layered manner, as compared to the case where a copper shield alone is employed.

Magnetic sheet 192 and copper shield 191 of the present embodiment are examples of "first shield member" and "second shield member", respectively, of the present invention.

It should be understood that the embodiments disclosed here are illustrative and nonrestrictive in every respect. The scope of the present invention is defined by the terms of claims, rather than the description of the embodiment set forth above, and is intended to include any modification within the scope and meaning equivalent to the terms of the claims.

REFERENCE SIGNS LIST

100 vehicle; 110, 340 secondary self-resonant coil; 115, 245 shield; 120, 350 secondary coil; 130 rectifier; 140

DC/DC converter; 150 power storage device; 160 PCU; 170 motor; 180 vehicle ECU; 190, 250 coil case; 191 copper shield; 192 magnetic sheet; 193 resin; 195, 255 plane; 200 power feed device; 210 AC power source; 220 high-frequency power driver; 230, 320 primary coil; 240, 330 primary self-resonant coil; 310 high-frequency power source; 360 load; 400 power reception unit; 500 power transmission unit.

The invention claimed is:

1. A power reception device for receiving electric power from a power transmission device including a transmission resonant coil, said power reception device comprising:
    a shield formed in a box shape having an opening at a side facing said power transmission device; and
    a reception resonant coil provided inside said shield and receiving electric power from said transmission resonant coil in a non-contact manner,
    said shield including:
    a metal shield formed in a box shape having said opening facing said power transmission device; and
    a magnetic shield arranged inside said metal shield with space or an object therebetween, and formed in a box shape having said opening facing said power transmission device,
    said reception resonant coil being arranged at a nearer position to said magnetic shield relative to said metal shield, a distance between said reception resonant coil and said magnetic shield being longer than a distance between said metal shield and said magnetic shield.

2. The power reception device according to claim 1, wherein said magnetic shield is configured including a magnetic material.

3. The power reception device according to claim 1, wherein said metal shield is a conductor containing copper.

4. The power reception device according to claim 1, wherein said opening is not shielded.

5. The power reception device according to claim 1, wherein said magnetic shield and said metal shield are arranged to form contact with each other.

6. The power reception device according to claim 1, wherein
    the reception resonant coil is cylindrically-shaped and includes a secondary self-resonant coil and a secondary coil.

7. A power transmission device for transmitting electric power to a power reception device including a reception resonant coil, said power transmission device comprising:
    a shield formed in a box shape having an opening at a side facing said power reception device; and
    a transmission resonant coil provided inside said shield and transmitting electric power to said reception resonant coil in a non-contact manner,
    said shield including:
    a metal shield formed in a box shape having said opening facing said power reception device; and
    a magnetic shield arranged inside said metal shield with space or an object therebetween, and formed in a box shape having said opening facing said power reception device,
    said transmission resonant coil being arranged at a nearer position to said magnetic shield relative to said metal shield, a distance between said transmission resonant coil and said magnetic shield being longer than a distance between said metal shield and said magnetic shield.

8. The power transmission device according to claim 7,
    the transmission resonant coil is cylindrically-shaped and includes a primary self-resonant coil and a primary coil.

\* \* \* \* \*